United States Patent
Leeser

(10) Patent No.: US 10,591,182 B2
(45) Date of Patent: Mar. 17, 2020

(54) APPARATUS FOR THERMAL CONTROL OF TUBING ASSEMBLY AND ASSOCIATED METHODS

(71) Applicant: Lam Research Corporation, Fremont, CA (US)

(72) Inventor: Karl F. Leeser, West Linn, OR (US)

(73) Assignee: Lam Research Corporation, Fremont, CA (US)

(*) Notice: Subject to any disclaimer, the term of this patent is extended or adjusted under 35 U.S.C. 154(b) by 629 days.

(21) Appl. No.: 15/209,006

(22) Filed: Jul. 13, 2016

(65) Prior Publication Data

US 2016/0320091 A1 Nov. 3, 2016

Related U.S. Application Data

(63) Continuation-in-part of application No. 14/675,603, filed on Mar. 31, 2015.
(Continued)

(51) Int. Cl.
*F24H 1/10* (2006.01)
*F28F 13/18* (2006.01)
(Continued)

(52) U.S. Cl.
CPC ............ *F24H 1/102* (2013.01); *F24H 3/002* (2013.01); *F24H 3/081* (2013.01); *F28F 13/18* (2013.01); *H01J 37/3244* (2013.01); *H01L 21/6719* (2013.01); *H01L 21/67184* (2013.01); *H01L 21/67778* (2013.01); *H01L 21/68707* (2013.01);
(Continued)

(58) Field of Classification Search
CPC . F16L 53/00; F16L 53/30; F16L 53/34; F16L 53/35; F16L 53/38; F24H 1/102; F24H 3/002; F24H 3/081; F28F 13/18; F28F 2013/001; H01J 37/3244; H01L 21/67187; H01L 21/6719; H01L 21/6778; H01L 21/68707; H01L 21/67778; H05B 3/56; H05B 2203/071; H05B 2203/021; H05B 2203/022; H05B 3/565; H05B 3/16; F16F 53/00; F16F 53/30; F16F 53/34; F16F 53/35; F16F 53/37; F16F 53/38

See application file for complete search history.

(56) References Cited

U.S. PATENT DOCUMENTS 2,719,907 A 10/1955 Combs
2,952,001 A 9/1960 Morey
(Continued)

*Primary Examiner* — Shawntina T Fuqua
(74) *Attorney, Agent, or Firm* — Penilla IP, APC

(57) ABSTRACT

Tubing structures are connected to each other to form a tubing assembly having one or more fluid pathways from a fluid entrance to a fluid exit. A heating device is bonded to the tubing structures along a length of the tubing assembly. The heating device has a flexibility to follow along one or more bends present along the length of the tubing assembly. The heating device includes one or more heater traces embedded within an encasing material. The encasing material is thermally conductive and electrically insulative. The one or more heater traces are formed of a material that generates heat in the presence of an electrical current. The heating device has a continuous and unbroken structure along the length of the tubing assembly. An encapsulation layer of thermal insulating material is disposed over the tubing assembly and covers the heating device.

27 Claims, 8 Drawing Sheets

Related U.S. Application Data

(60) Provisional application No. 62/192,560, filed on Jul. 14, 2015.

(51) Int. Cl.
| | |
|---|---|
| *F24H 3/00* | (2006.01) |
| *H05B 3/56* | (2006.01) |
| *H01L 21/67* | (2006.01) |
| *H01L 21/687* | (2006.01) |
| *H01L 21/677* | (2006.01) |
| *H01J 37/32* | (2006.01) |
| *F24H 3/08* | (2006.01) |
| *F28F 13/00* | (2006.01) |

(52) U.S. Cl.
CPC .......... *H05B 3/56* (2013.01); *F28F 2013/001* (2013.01); *H05B 2203/017* (2013.01); *H05B 2203/021* (2013.01); *H05B 2203/022* (2013.01)

(56) References Cited

U.S. PATENT DOCUMENTS

| | | | |
|---|---|---|---|
| 3,268,846 A | 8/1966 | Morey | |
| 5,482,739 A | 1/1996 | Hey | |
| 9,353,993 B2* | 5/2016 | Warmuth | F27D 7/00 |
| 2007/0108176 A1* | 5/2007 | Ellis | H05B 3/50 |
| | | | 219/228 |
| 2010/0290764 A1* | 11/2010 | Borgmeier | F16L 25/01 |
| | | | 392/468 |

* cited by examiner

APPARATUS FOR THERMAL CONTROL OF TUBING ASSEMBLY AND ASSOCIATED METHODS

CLAIM OF PRIORITY

This application claims priority under 35 U.S.C. 119(e) to U.S. Provisional Patent Application No. 62/192,560, filed Jul. 14, 2015, the disclosure of which is incorporated herein by reference in its entirety. This application is also a continuation-in-part (CIP) application under 35 U.S.C. 120 of prior U.S. patent application Ser. No. 14/675,603, filed Mar. 31, 2015, the disclosure of which is incorporated herein by reference in its entirety.

BACKGROUND

1. Field of the Invention

The present invention relates to semiconductor chip fabrication facilities.

2. Description of the Related Art

Many modern semiconductor chip fabrication processes require process gases and/or liquids to be supplied in a carefully controlled manner to a reaction chamber in which the process gases and/or liquids are applied to affect processing of a semiconductor wafer. Provision of the process gases and/or liquids to the reaction chambers can include controlling a temperature of the process gases and/or liquids in route to the reaction chamber and just prior to input into the reaction chambers. It is within this context that the present invention arises.

SUMMARY

In an example embodiment, a tubing assembly is disclosed. The tubing assembly includes a plurality of tubing structures connected to each other in a configuration providing one or more fluid pathways through the plurality of tubing structures from a fluid entrance of the plurality of tubing structures to a fluid exit of the plurality of tubing structures. The tubing assembly also includes a heating device bonded to the plurality of tubing structures along a length of the plurality of tubing structures in their connected configuration. The heating device has a flexibility to enable its placement along one or more bends present along the length of the plurality of tubing structures in their connected configuration. The heating device includes one or more heater traces embedded within an encasing material. The encasing material is thermally conductive and electrically insulative. The one or more heater traces is/are formed of a material that generates heat in the presence of an electrical current. The heating device has a continuous and unbroken structure along the length of the plurality of tubing structures in their connected configuration. The tubing assembly also includes an encapsulation layer of thermal insulating material disposed over the plurality of tubing structures and covering the heating device.

In an example embodiment, a method is disclosed for manufacturing a tubing assembly. The method includes connecting a plurality of tubing structures together in a tubing assembly configuration providing one or more fluid pathways through the plurality of tubing structures from a fluid entrance of the tubing assembly configuration to a fluid exit of the tubing assembly configuration. The method also includes bonding a heating device to the plurality of tubing structures along a length of the tubing assembly configuration. The heating device has a flexibility to enable its placement along one or more bends present along the length of tubing assembly configuration. The heating device includes one or more heater traces embedded within an encasing material. The encasing material is thermally conductive and electrically insulative. The one or more heater traces is/are formed of a material that generates heat in the presence of an electrical current. The heating device has a continuous and unbroken structure along the length of the tubing assembly configuration. The method also includes applying an encapsulation layer of thermal insulating material over the tubing assembly configuration to cover the heating device.

Other aspects and advantages of the invention will become more apparent from the following detailed description, taken in conjunction with the accompanying drawings, illustrating by way of example the present invention.

DETAILED DESCRIPTION

In the following description, numerous specific details are set forth in order to provide a thorough understanding of the present invention. It will be apparent, however, to one skilled in the art that the present invention may be practiced without some or all of these specific details. In other instances, well known process operations have not been described in detail in order not to unnecessarily obscure the present invention.

Figure 1:
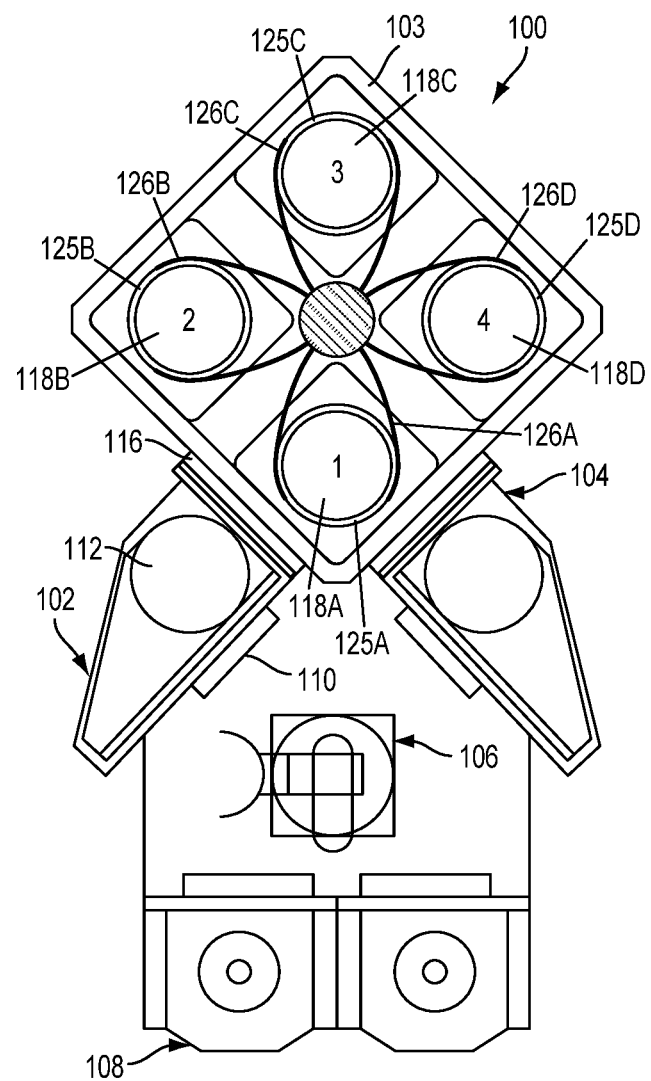
FIG. 1 shows a schematic top view of an example embodiment of a multi-station processing tool within a semiconductor fabrication facility.

FIG. 1 shows a schematic top view of an example embodiment of a multi-station processing tool 100 within a semiconductor fabrication facility. The multi-station processing tool 100 includes an inbound load lock 102 and an outbound load lock 104. A robot 106, at atmospheric pressure, is configured to move a substrate, e.g., semiconductor wafer, from a cassette loaded through a pod 108 into inbound load lock 102 via an atmospheric port 110, and place the substrate on a support 112 within the inbound load lock 102. Inbound load lock 102 is coupled to a vacuum source (not shown) so that, when atmospheric port 110 is closed, inbound load lock 102 may be pumped down. Inbound load lock 102 also includes a chamber transport port 116 interfaced with processing chamber 103. Thus, when chamber transport port 116 is opened, another robot (not shown) may move the substrate from inbound load lock 102 to a substrate support 118 of a first process station 1 for processing. The example processing chamber 103 includes four process stations, numbered from 1 to 4. It should be appreciated, however, that other embodiments of the processing chamber 103 can include more or less process stations, and can be arranged in configurations different than what is shown by way of example for the processing tool 100 in FIG. 1.

In some embodiments, processing chamber 103 may be configured to maintain a low pressure environment so that substrates may be transferred among the process stations 1-4 within the processing chamber 103 using carrier rings 125A-125D and spider forks 126A-126D without experiencing a vacuum break and/or air exposure. The spider forks 126A-126D rotate and enable transfer of substrates between process stations. The transfer occurs by enabling the spider forks 126A-126D to lift the carrier rings 125A-125D from an outer undersurface, which lifts the substrates, and rotates the substrates and carrier rings 125A-125D together to the next process station. Each process station depicted in FIG. 1 includes a process station substrate support 118A-118D and process fluid supply lines and removal lines. It should be appreciated that the processing tool 100 and each of the process stations 1-4 represents a very complex system including numerous interrelated and interfacing components. In order to avoid unnecessarily obscuring the present invention, details of the processing stations 1-4 and other interrelated and interfacing components are not further described herein.

Each process station 1-4 can be defined to perform one or more substrate processing/manufacturing operations. The processing/manufacturing operations performed by the process stations 1-4 can include utilization of various fluids (gases and/or liquids) which are delivered to and removed from the process stations 1-4 by various tubing arrangements. For example, with reference back to FIG. 1, within the semiconductor fabrication facility, the spaces between, above, below, around, and within the processing tool 100 and its various process stations 1-4 can include a complex network of tubing for delivering various process gases and/or liquids to the various process stations and for removing various process gases and/or liquids from the various process stations 1-4.

In some embodiments, portions of this network of tubing needs to be temperature controlled so as to establish and control temperatures of the various process fluids prior to their arrival at the various process stations 1-4. In some embodiments, tubing is heated and insulated to affect heating of the various process fluids as they travel through the tubing network to the process stations 1-4. In some embodiments, the heating of the tubing is provided by electrical resistance heaters in contact with or in close proximity to the tubing. In such embodiments, the tubing is metallic or made of a material suitable to withstand exposure to the heat flux emanating from the electrical resistance heaters.

In some embodiments, portions of the tubing network used to convey various process fluids to and/or from the process stations 1-4 are fabricated as separate tubing assemblies outside of the semiconductor fabrication facility. The separate tubing assemblies are then fit together within the semiconductor fabrication facility to form the required network of tubing for delivery of various process fluids to the process stations 1-4 and/or for removal of various process fluids from the process stations 1-4. Some sections or flow paths of the tubing network may need to be temperature controlled. The tubing assemblies within these temperature controlled sections of the tubing network can be fabricated with integral heating components. In some embodiments, the integral heating components of various tubing assemblies can be connected together as the various tubing assemblies are fit together within the semiconductor fabrication facility, so as to form an electrical heating circuit for sections of the tubing network. And, the electrical heating circuit can be connected to a control system for controlling the heating of the tubing, which in turn controls the temperature of the fluids being delivered to and/or removed from the process stations 1-4.

Some heating devices may be fabricated in fixed lengths for use with an individual, linear tubing section of corresponding length. With these heating devices, each linear section of tubing in a multiple tube assembly will have its own heating device, thereby resulting in multiple heating devices located along the length of the overall tubing assembly. Controlling the locations of adjacent heating devices as well as managing the many layers in heating device construction is very laborious and does not lend itself to automation. Finding a way to improve the process of manufacturing tubing assemblies with integrated heating capability is necessary for substantial cost reduction. Methods and structures are disclosed herein for manufacturing a tubing assembly with an integrated heating capability by attaching a scalable heating device to the tubing assembly. The scalable heating device is not specific to a given tubing assembly and is manufactured separately from the tubing assembly. In some embodiments, the heating device disclosed herein is manufactured in a cut-to-length configuration, such that the heating device can be manufactured in high volume, thereby reducing overall cost of the final tubing assembly. In some embodiments, the scalable heating device disclosed herein can be constructed in high volume as a continuous heater tape that does not need to be specific to the particular tubing assembly, and heater segments can be cut-to-length from the continuous heater tape as needed during fabrication of a given tubing assembly.

Figure 2:
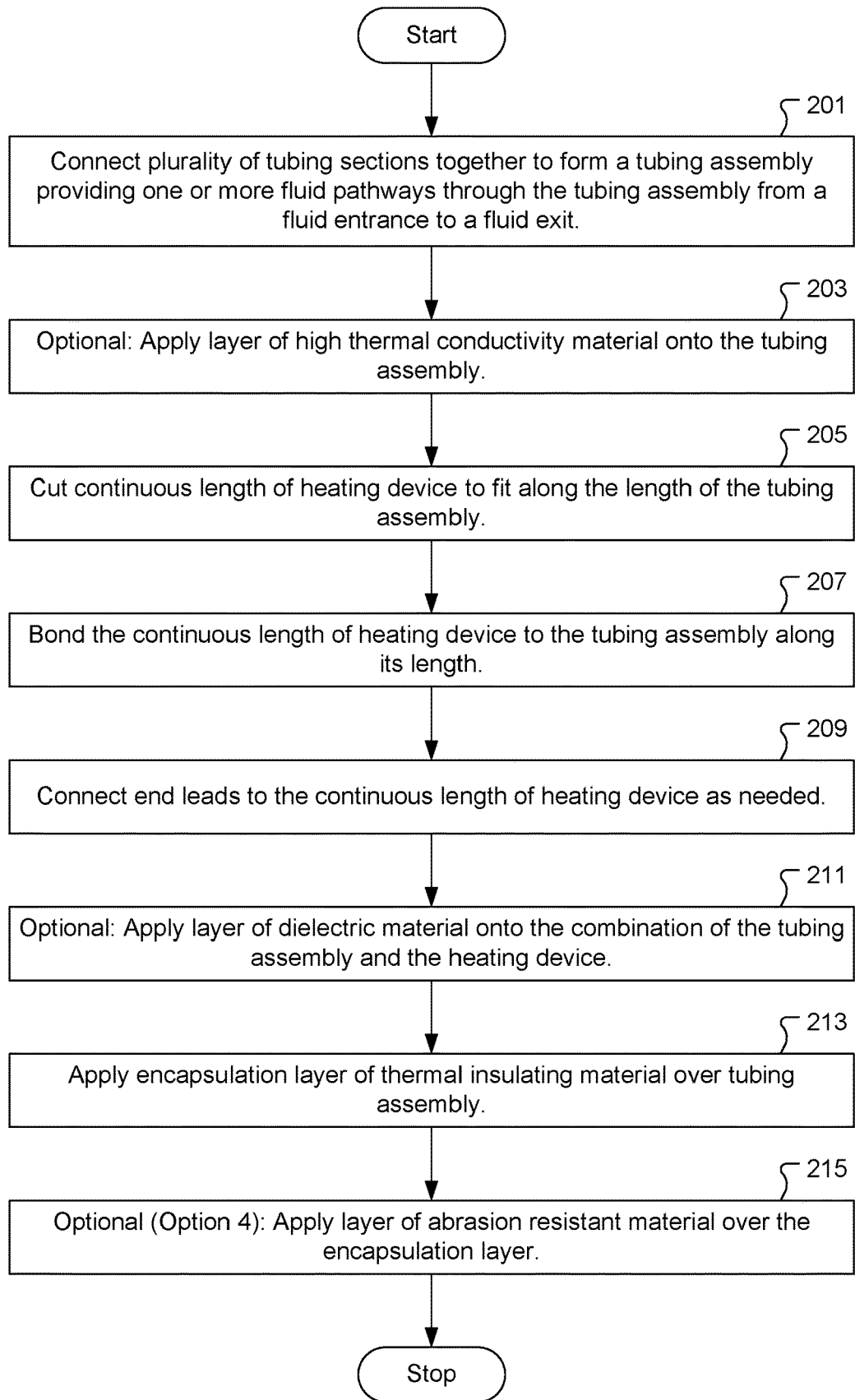
FIG. 2 shows a flowchart of a method for manufacturing a tubing assembly with integral heating components, in accordance with some example embodiments of the present invention.
Figure 3:
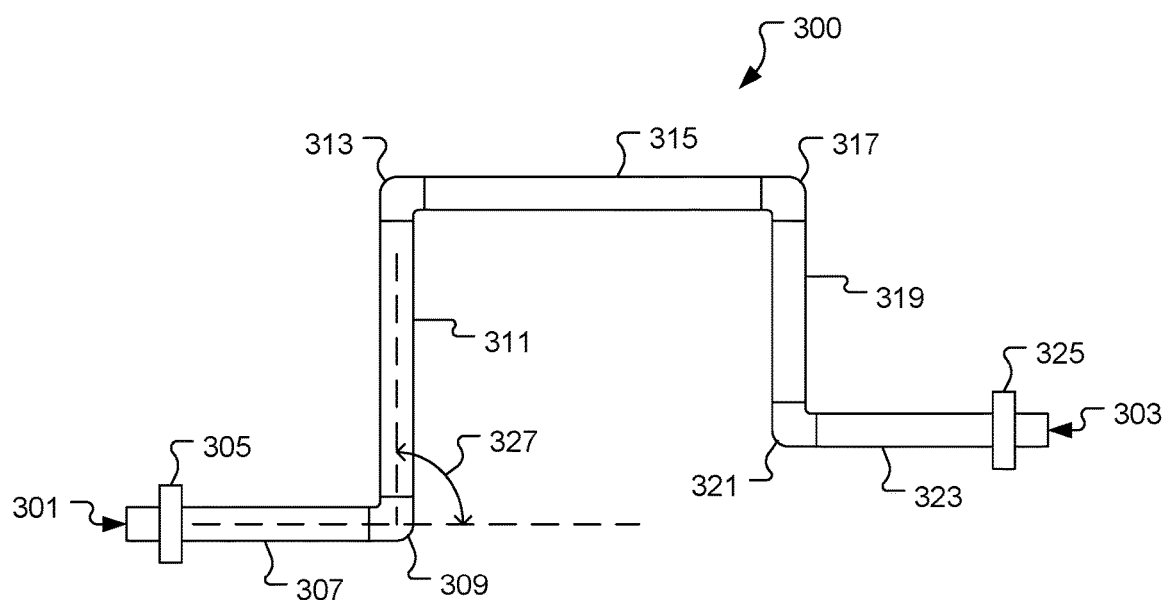
FIG. 3 shows an example tubing assembly as connected together in operation, in accordance with an example embodiment of the present invention.

FIG. 2 shows a flowchart of a method for manufacturing a tubing assembly with integral heating components, in accordance with some example embodiments of the present invention. The method includes an operation 201 for connecting a plurality of tubing structures together in a tubing assembly configuration providing one or more fluid pathways through the plurality of tubing structures from a fluid entrance of the plurality of tubing structures to a fluid exit of the plurality of tubing structures. FIG. 3 shows an example tubing assembly as connected together in operation 201, in accordance with an example embodiment of the present invention. The tubing assembly 300 includes tubing structures 305, 307, 309, 311, 313, 315, 317, 319, 321, 323, and 325 connected together to provide a fluid pathway through the tubing assembly 300 from a fluid entrance 301 to a fluid exit 303. In some embodiments, the tubing structures of the tubing assembly 300 are welded together to form a weldment. However, in other embodiments, some or all of the tubing structures can be connected together using non-welding techniques, such as by brazing or soldering. Also, in some embodiments, one or more of the tubing structures can include an end flange structure to provide for assembly using a gasket/seal-ring and fasteners such as bolts.

It should be understood that the number of tubing structures and their configuration as depicted in the tubing assembly 300 of FIG. 3 is for purposes of description and is not intended to place any limit or restriction on how the tubing assembly can be configured in operation 201. The tubing assembly configuration as connected together in operation 201 can include any number of tubing structures, any shape of tubing structure, and any size of tubing structure, and can be put together using any assembly/connection process. In some embodiments, however, the tubing assembly configuration as connected in operation 201 includes at least two tubing structures that are connected within the tubing assembly in an angled configuration relative to each other such that an angle of less than 180 degrees exists between axial centerlines of the at least two tubing structures. For example, the tubing assembly 300 of FIG. 3 shows tubing structures 307 and 311 that are connected at an angled configuration relative to each other such that an angle 327 of less than 180 degrees exists between their axial centerlines.

In some embodiments, operation 201 is performed under a constraint that bends and/or fittings in the tubing assembly can only be located at predetermined spacings along the length of the tubing assembly, where each predetermined spacing corresponds to an integer multiple of a unit cut length of a heating device to be attached to the tubing assembly. For example, if the unit cut length of the heating device is one inch, then the predetermined spacings for locating bends and/or fittings along the length of the tubing assembly is an integer multiple of one inch, i.e., an integer number of inches. As another example, if the unit cut length of the heating device is one-half inch, then the predetermined spacings for locating bends and/or fittings along the length of the tubing assembly is an integer multiple of one-half inch. It should be understood that the unit cut length of one inch and one-half inch are provided by way of example. In other embodiments, the unit cut length of the heating device can be essentially any size.

The method of FIG. 2 continues with an optional operation 203 in which a layer of high thermal conductivity material is applied to the tubing assembly as formed in operation 201. For example, in some embodiments, "cold spray" coating technology is used to apply a layer of high thermal conductivity material such as copper or aluminum to the tubing assembly. The high thermal conductivity material has a greater thermal conductivity than the material of which the tubing assembly is formed, e.g., stainless steel. The high thermal conductivity material applied in operation 203 provides enhanced heat transfer around the circumference of the tubing and fittings that compose the tubing assembly, thereby allowing the method of heating the tubing assembly to be less precise and still achieve a high quality and uniform heating of the tubing assembly. Additionally, in some embodiments, a superior adhesion of copper to stainless steel can be achieved such that a vacuum-tight junction is formed between the applied copper and the stainless steel of the tubing assembly. The "cold spray" coating method is highly conformal and provides rapid deposition rates, e.g., of approximately 0.5 inch per minute or more.

Figure 4:
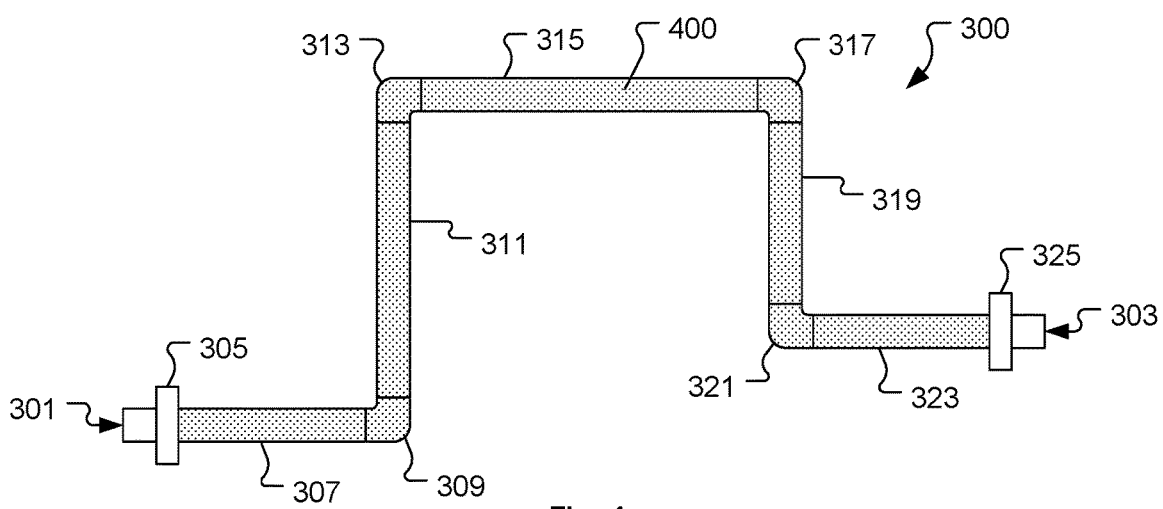
FIG. 4 shows the tubing assembly of FIG. 3 with a layer of high thermal conductivity material applied to the external surfaces of the tubing structures.

FIG. 4 shows the tubing assembly 300 of FIG. 3 with a layer of high thermal conductivity material 400 applied to the external surfaces of the tubing structures 307, 309, 311, 313, 315, 317, 319, 321, 323. In some embodiments, the operation 203 can be performed to apply the layer of the high thermal conductivity material to some of the tubing structures while not applying the layer of the high thermal conductivity material to some of the tubing structures. For example, FIG. 4 shows that the layer of the high thermal conductivity material is not applied to the tubing structures 305 and 325. In some embodiments, the operation 203 can be performed to apply the layer of the high thermal conductivity material to all of the tubing structures.

The method of FIG. 2 continues with an operation 205 in which a continuous length of the heating device is cut to fit along the length of the tubing assembly. The length of the heating device takes into account bends and fittings present along the length of the tubing assembly. As previously mentioned, the heating device is configured to be cut at an interval of the unit cut length. The heating device is configured to be flexible to provide for placement of the heating device along the bends and contours of the tubing assembly. In some embodiments, the heating device can include narrow copper traces embedded in polyimide to provide sufficient flexibility of the heating device in order to follow the bends and contours of the tubing assembly. The heating device can also include multiple conductor traces, e.g., copper traces, to provide for increased thermal output per unit length of the heating device.

Figure 5:
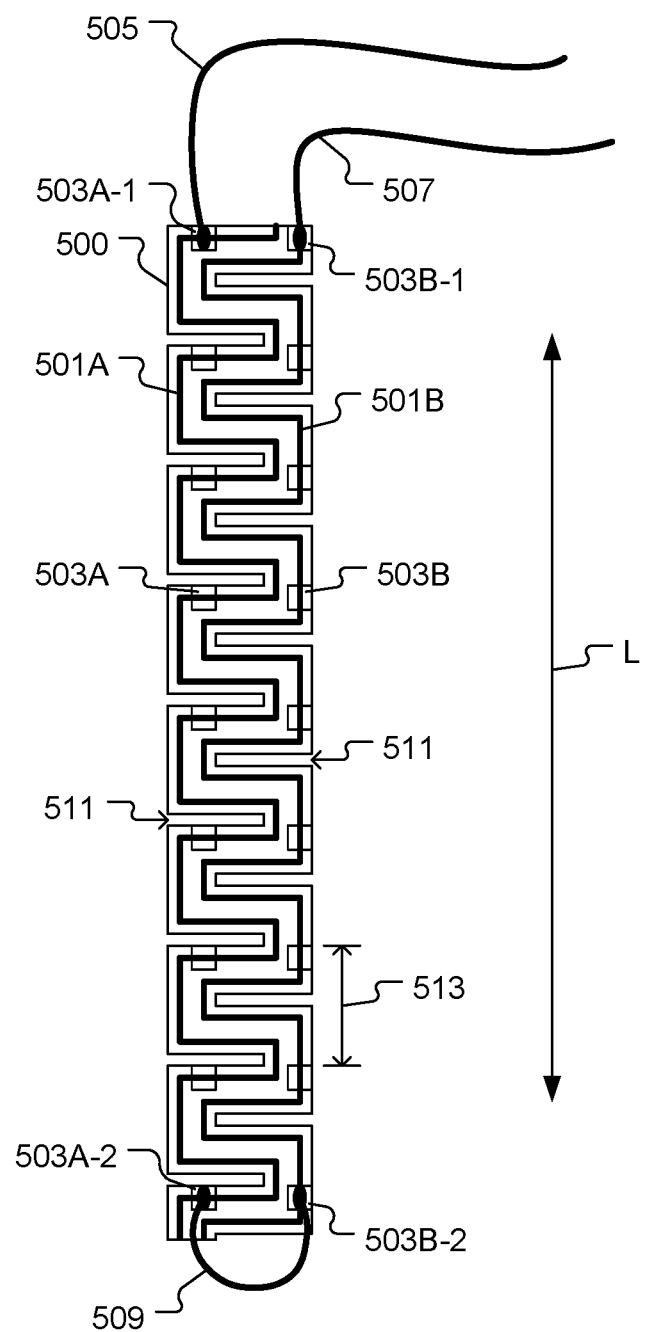
FIG. 5 shows an example heating device configuration, in accordance with some embodiments of the present invention.

FIG. 5 shows an example heating device 500 configuration, in accordance with some embodiments of the present invention. In the example of FIG. 5, the heating device 500 has a serpentine configuration formed by regularly spaced slits 511 located at opposing sides of the heating device 500 in an alternating manner along its length direction (L). The slits 511 provide the heating device 500 with flexibility to enable positioning of the heating device 500 along the bends and contours of the tubing assembly. The heating device 500 includes conductive resistance heater traces 501A and 501B embedded within an encasing material that is thermally conductive and electrically insulative. In some embodiments, the encasing material is polyimide. In other embodiments, the encasing material of the heating device 500 in which the heater traces 501A and 501B are embedded can be formed of an electrically insulative, thermally conductive, and sufficiently flexible material other than polyimide. The heater traces 501A and 501B are arranged in an adjacent and substantially parallel manner to each other following along the serpentine shape of the heating device 500. In some embodiments, the resistance heater traces 501A and 501B are configured as narrow copper traces embedded in polyimide. Also, in other embodiments, the heater traces 501A and 501B can be formed of another electrically conductive and sufficiently flexible material suitable for use as an electrical resistance heating element, such as Nichrome, which is a non-magnetic alloy of nickel and chromium having a high resistivity and resistance to oxidation at high temperature, or Constantan, which is a copper-nickel alloy having a substantially constant resistivity over a broad range of temperature, or Kanthal™, such as Alloy 875/815, which is a family of alloys of iron-chromium-aluminum having intermediate electrical resistance and an ability to withstand high temperatures, or Evanohm (Alloy 800), or Advance™ (Cupron or Alloy 45), or Midohm™ (Alloy 180), or Balco (Alloy 120), or Alloy 30, or Alloy 60, or Alloy 90, among others.

FIG. 5 also shows that the example heating device 500 is configured in a cut-to-length manner, having a unit cut length 513. Each unit cut length of the heating device 500 includes heater trace access locations 503A and 503B to enable electrical contact access to each of the heater traces 501A and 501B, respectively. The heater trace access locations 503A and 503B provide for connection of external conductors to the heater traces 501A and 501B. For example, external conductors 505 and 507 for connection to positive and negative terminals, respectively, of a power supply can be connected to the heater traces 501A and 501B at one end of the heating device 500 by way of the heater trace access locations 503A-1 and 503B-1. Also, an external conductor 509 can be connected to the heater traces 501A and 501B at the other end of the heating device 500 by way of the heater trace access locations 503A-2 and 503B-2, so as to complete the electrical circuit through the heating device 500.

Figure 6:
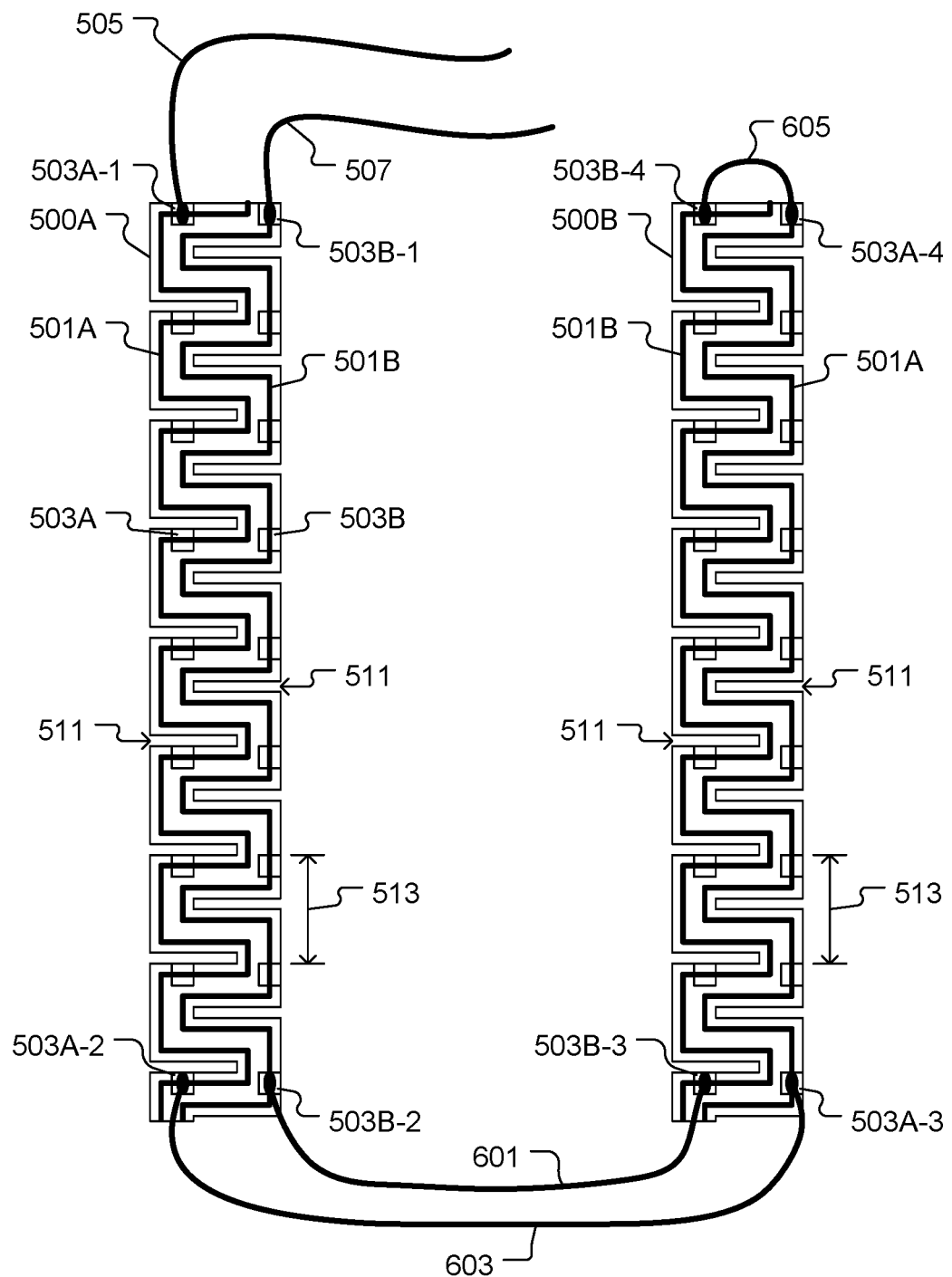
FIG. 6 shows two cut sections of the heating device having their heater traces electrically connected together, in accordance with some example embodiments of the present invention.

Also, in some embodiments, the heater trace access locations 503A and 503B can be used to connect separate cut sections of the heating device 500. For example, FIG. 6 shows two cut sections of the heating device 500A and 500B having their heater traces 501A and 501B electrically connected together, in accordance with some example embodiments of the present invention. The heater trace 501A of heating device 500A is electrically connected to the heater trace 501A of heating device 500B through a conductor 601 by way of heater trace access locations 503A-2 and 503A-3. Similarly, the heater trace 501B of heating device 500A is electrically connected to the heater trace 501B of heating device 500B through a conductor 603 by way of heater trace access locations 503B-2 and 503B-3. Also, in the example of FIG. 6, an external conductor 605 is connected to the heater traces 501A and 501B at the other end of the heating device 500B by way of the heater trace access locations 503A-4 and 503B-4, so as to complete the electrical circuit through the combination of heating devices 500A and 500B.

Figure 7:
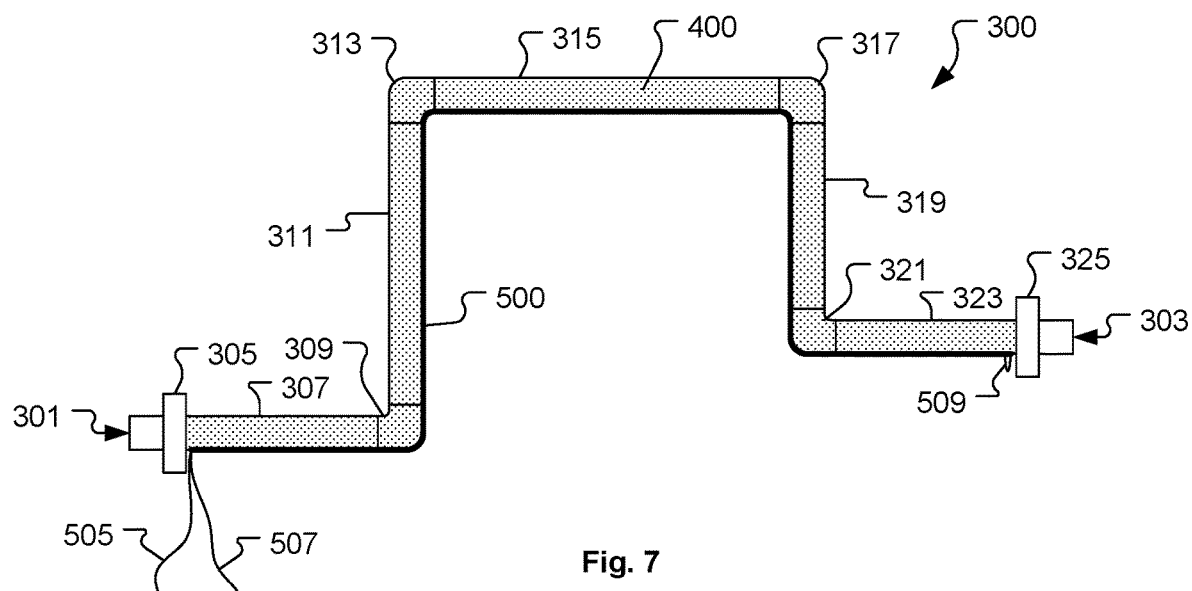
FIG. 7 shows the tubing assembly of FIG. 4 with the continuous length of the heating device conformally bonded to the tubing assembly, in accordance with some embodiments of the present invention.

With reference back to FIG. 2, the method continues with an operation 207 for bonding the continuous length of heating device, e.g., heating device 500, as cut in operation 205 to the tubing assembly along the length of the tubing assembly. In the embodiment using the example heating device 500 of FIG. 5, the serpentine configuration of the heating device 500 enables conformal bonding of the heating device 500 to the geometry of the tubing assembly, including around swept bends and fittings along the length of the tubing assembly. FIG. 7 shows the tubing assembly 300 of FIG. 4 with the continuous length of the heating device 500 conformally bonded to the tubing assembly 300, in accordance with some embodiments of the present invention. In the embodiment in which the high thermal conductivity material 400 is applied to the external surfaces of the tubing assembly 300, the continuous length of the heating device 500 is conformally bonded to the high thermal conductivity material 400. In the embodiment in which the high thermal conductivity material 400 is not applied to the external surfaces of the tubing assembly 300, the continuous length of the heating device 500 is conformally bonded directly to the tubing material of the tubing assembly 300.

The method of FIG. 2 continues with an operation 209 for connecting end leads to the continuous length of heating device 500, as needed. For example, FIG. 7 shows the conductors 505 and 507 from FIG. 5 connected as end leads to the heating device 500. Also, FIG. 7 shows the conductor 509 from FIG. 5 connected as a bridging wire to connect the heater traces 501A and 501B. In some embodiments, the end leads are soldered to the heating device 500 in operation 209.

The method of FIG. 2 continues from operation 209 with an optional operation 211 for applying a layer of dielectric material onto the combination of the tubing assembly and the heating device. In some embodiments, the dielectric material applied in the operation 211 can be both electrically insulating and thermally conductive. In some embodiments, the dielectric material applied in the operation 211 can be polyimide. In some embodiments, the dielectric material applied in the operation 211 can be both electrically insulating and thermally insulating. It should be appreciated that the dielectric material applied in the operation 211 can be essentially any type of dielectric material that is capable of providing a required amount of electrical insulation. In various embodiments, the dielectric material can be applied in the operation 211 to have a thickness with a range extending from about 10 microns to about 500 microns. However, it should be understood that in other embodiments the dielectric material can be applied in the operation 211 to have a thickness greater than 500 microns.

Figure 8:
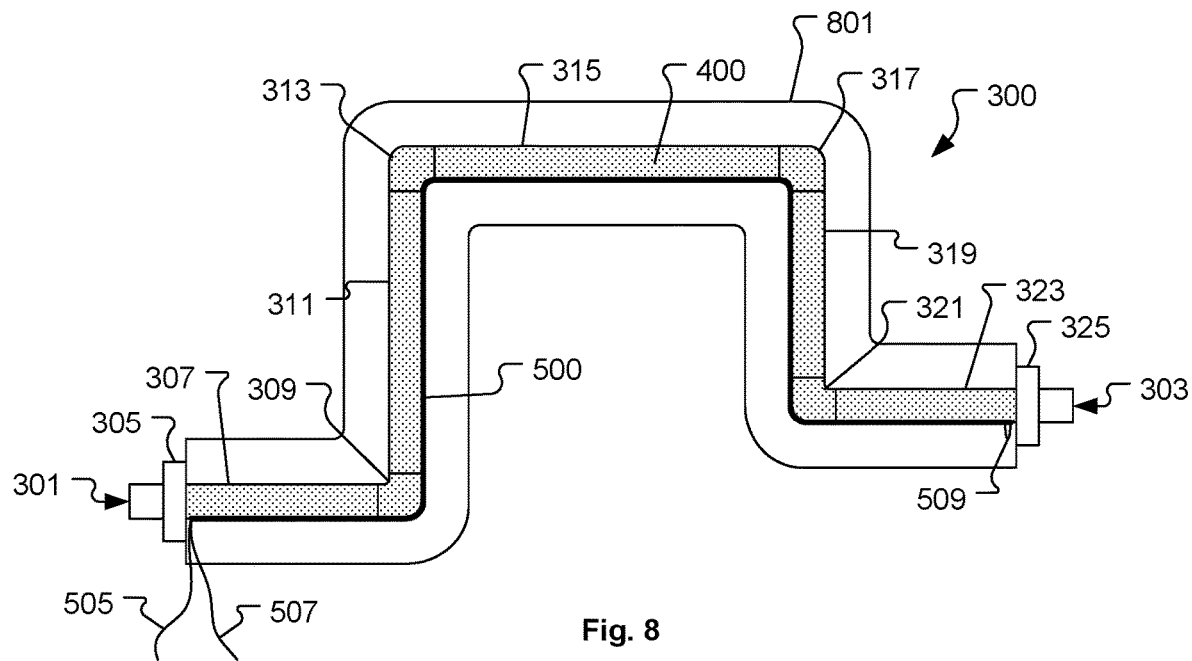
FIG. 8 shows an encapsulation layer of thermal insulating material disposed over the tubing assembly so as to cover the heating device.

The method of FIG. 2 continues with an operation 213 for applying an encapsulation layer of thermal insulating material over the tubing assembly in a manner to cover the heating device 500 as bonded to the tubing assembly in the operation 207, while leaving electrical leads of the heating device 500 exposed, i.e., not covered by the encapsulation layer of thermal insulating material. For example, FIG. 8 shows an encapsulation layer of thermal insulating material 801 disposed over the tubing assembly 300 so as to cover the heating device 500, while leaving electrical leads of the heating device 500 exposed. In various embodiments, the encapsulation layer of thermal insulating material 801 applied in the operation 213 can be formed of silicon rubber or other type of synthetic material containing a low amount of volatile organic compounds (VOCs) and/or having a pore size that will not trap VOCs, among others. In some embodiments, the encapsulation layer of thermal insulating material 801 applied in the operation 213 can be formed of foam structures, rubber structures, and/or silicon structures, having low VOC content, among others. In some embodiments, the encapsulation layer of thermal insulating material 801 is also a dielectric material. In various embodiments, the encapsulation layer of thermal insulating material 801 can be applied in the operation 213 to have a thickness with a range extending from about 1 millimeter (mm) to about 14 mm. In some embodiments, the encapsulation layer of thermal insulating material 801 can be applied in the operation 213 to have a thickness of about 6 mm.

Figure 9:
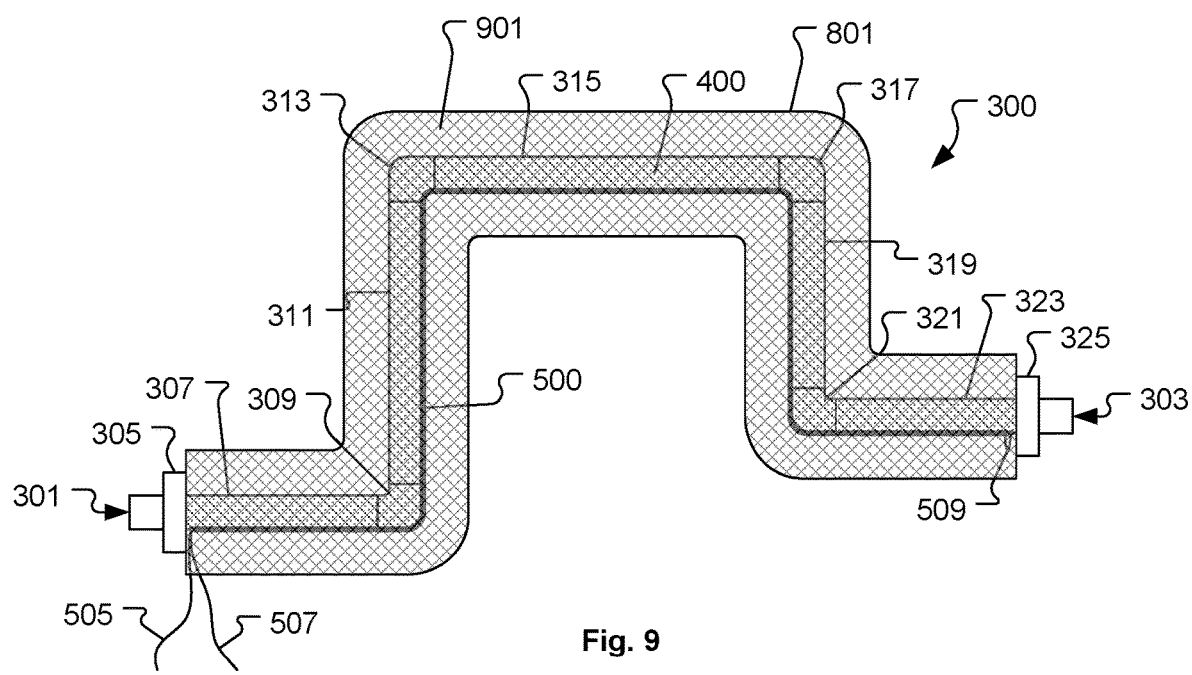
FIG. 9 shows the tubing assembly of FIG. 8 with a layer of abrasion resistant material applied over the encapsulation layer of thermal insulating material.

Also, the method can include an optional operation 215 for applying a layer of an abrasion resistant material over the encapsulation layer 801 that was applied in operation 213. In some embodiments, the operation 215 is performed to apply the layer of abrasion resistant material over portions of the encapsulation layer 801 where abrasion resistance is required once the tubing assembly is fit up within the semiconductor fabrication facility. In some embodiments, the operation 215 is performed to apply the layer of abrasion resistant material over an entirety of the encapsulation layer 801. For example, FIG. 9 shows the tubing assembly 300 of FIG. 8 with a layer of abrasion resistant material 901 applied over the encapsulation layer of thermal insulating material 801. In various embodiments, the layer of abrasion resistant material 901 applied in the operation 215 can be formed of flexible material, such as polyimide, nylon, silicon, fiber-reinforced silicon, and/or Kevlar™, among others. In some embodiments, the layer of abrasion resistant material 901 applied in the operation 215 can be formed as a jacket covering or as a mesh sleeve or as a tube. In various embodiments, the layer of abrasion resistant material 901 can be applied in the operation 215 to have a thickness with a range extending from about 50 microns to about 400 microns. In some embodiments, the layer of abrasion resistant material 901 can be applied in the operation 215 to have a thickness up to about 5 mm.

Figure 10:
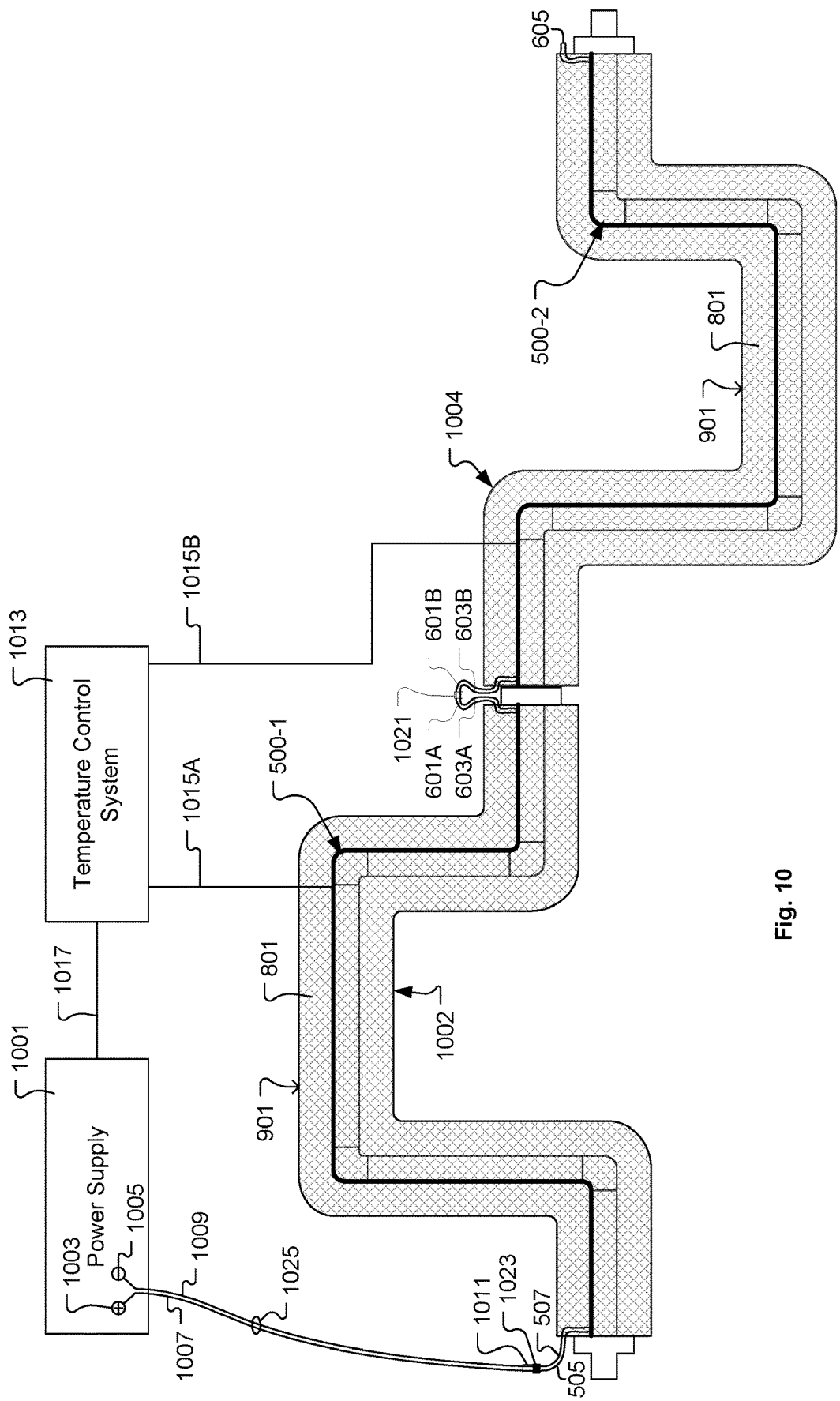
FIG. 10 shows an example fit up of tubing assemblies having integral heating components as manufactured in accordance with the method of FIG. 2, in accordance with some example embodiments of the present invention.

FIG. 10 shows an example fit up of tubing assemblies having integral heating components as manufactured in accordance with the method of FIG. 2, in accordance with some example embodiments of the present invention. Specifically, FIG. 10 shows a first tubing assembly 1002 fit together with a second tubing assembly 1004. For sake of description, each of the tubing assemblies 1002 and 1004 is like the previously described tubing assembly 300. It is envisioned that each of the tubing assemblies 1002 and 1004 is fabricated outside of the semiconductor fabrication facility and then fit together inside the semiconductor fabrication facility at or near their final place of installation. In the example configuration of FIG. 10, the heating device 500-1 of the first tubing assembly 1002 is electrically connected to the heating device 500-2 of the second tubing assembly 1004 through the conductors 601A, 601B, 603A, and 603B, in the manner as previously discussed with regard to FIG. 6. In some embodiments, an electrical connector 1021 is used to electrically connect the conductor 601A to the conductor 601B, and to electrically connect the conductor 603A to the conductor 603B. Also, the heater traces of the heating device 500-2 are electrically connected to each other through the conductor 605, in the manner as previously discussed with regard to FIG. 6. And, the heater traces of the heating device 500-1 are electrically connected to the conductors 505 and 507, respectively, in the manner as previously discussed with regard to FIGS. 5 and 6, with the conductors 505 and 507 respectively connected to two prongs of an electrical connector 1023, which is in turn electrically connected to an electrical connector 1011 of a power supply line 1025.

The power supply line 1025 includes two separate electrical conductors 1007 and 1009 that run to a power supply 1001. In the example of FIG. 10, the power supply 1001 is a direct current (DC) power supply and includes a positive terminal 1003 and a negative terminal 1005. The electrical conductor 1007 is electrically connected to the positive terminal 1003, and the electrical conductor 1009 is electrically connected to the negative terminal 1005. The power supply 1001 is defined to provide a flow of electric current through the heater traces of the heating devices 500-1 and 500-2, which in turn causes heating of the tubing structures within each of the first and second tubing assemblies 1002 and 1004, which in turn causes heating of the fluid traveling through the first and second tubing assemblies 1002 and 1004. The power supply 1001 is defined to provide the flow of electric current through the heater traces of the heating devices 500-1 and 500-2 in a controlled manner to as maintain a target temperature of the first and second tubing assemblies 1002 and 1004, and correspondingly of the fluid traveling through the first and second tubing assemblies 1002 and 1004. It should be understood that although the power supply 1001 is shown as a DC power supply in the example embodiments of FIG. 10, in other embodiments the power supply 1001 can be an alternating current (AC) power supply, with the positive and negative terminals 1003 and 1005 representing electrical terminals of the AC power supply.

FIG. 10 also shows that in some embodiments a temperature control system 1013 can be implemented to provide for control of the temperature of the tubing assemblies 1002 and 1004. The temperature control system 1013 can be connected to receive inputs from a number of thermocouple leads 1015A, 1015B (or essentially any other type of temperature sensing device) deployed to measure the temperature of the tubing assemblies 1002 and 1004. It should be appreciated that any number of temperature sensors can be deployed at any location on the tubing assemblies 1002 and 1004 as necessary to provide temperature inputs required for controlling the temperature of the fluid flowing through the tubing assemblies 1002 and 1004. The temperature control system 1013 is configured to transmit control signals to the power supply 1001, by way of connection 1017, so as to control the power supply 1001 based on the monitored temperature inputs (as received through 1015A, 1015B) so as to control the heating provided by the two heating devices 500-1 and 500-2, and thereby control the temperature of the fluid flowing through the tubing assemblies 1002 and 1004.

It should be understood that the example system depicted in FIG. 10 is a simplified example provided for descriptive purposes. In various embodiments, any number and any configuration of tubing assemblies as manufactured in accordance with the method of FIG. 2 can be fit together in the semiconductor fabrication facility. Also, in some embodiments, one or more power supplies, e.g., 1001, can be connected to provide electrical power to any number of and any configuration of heating devices 500 of tubing assemblies as manufactured in accordance with the method of FIG. 2, as necessary to appropriately heat the fluid flowing through the tubing assemblies.

Based on the description presented herein, it should be understood that a tubing assembly is disclosed as including a plurality of tubing structures connected to each other in a configuration providing one or more fluid pathways through the plurality of tubing structures from a fluid entrance of the plurality of tubing structures to a fluid exit of the plurality of tubing structures. In some embodiments, the plurality of tubing structures are welded together to provide the one or more fluid pathways through the plurality of tubing structures. However, in other embodiments, the plurality of tubing structures can be connected together using methods other than welding, such as with seals and fasteners. Also, in some embodiments, the plurality of tubing structures includes at least two tubing structures that are connected within the tubing assembly at an angled configuration relative to each other such that an angle of less than 180 degrees exists between axial centerlines of the at least two tubing structures. A heating device is bonded to the plurality of tubing structures along a length of the plurality of tubing structures in their connected configuration. The heating device has a flexibility to enable its placement along one or more bends present along the length of the plurality of tubing structures in their connected configuration. The heating device includes one or more heater traces embedded within an encasing material. The encasing material is thermally conductive and electrically insulative. The one or more heater traces is/are formed of a material that generates heat in the presence of an electrical current. The heating device has a continuous and unbroken structure along the length of the plurality of tubing structures in their connected configuration. And, an encapsulation layer of thermal insulating material is disposed over the plurality of tubing structures and covers the heating device. Also, in some embodiments, a layer of an abrasion resistant material is disposed over the encapsulation layer of thermal insulating material.

In some embodiments, a layer of a thermally conductive material is conformally disposed on the plurality of tubing structures so as to circumferentially cover the plurality of tubing structures. In these embodiments, the heating device is bonded to the layer of thermally conductive material along the length of the plurality of tubing structures in their connected configuration, and the encapsulation layer of thermal insulating material is disposed to cover the layer of thermally conductive material and the heating device. In some embodiments, the layer of thermally conductive material is applied to the plurality of tubing structures using a cold spray coating application. In some embodiments, the layer of thermally conductive material is copper and the plurality of tubing structures are formed of stainless steel. In some embodiments, the layer of thermally conductive material is aluminum and the plurality of tubing structures are formed of stainless steel.

In some embodiments, a layer of a dielectric material is conformally disposed on the plurality of tubing structures so as to circumferentially cover the plurality of tubing structures. In these embodiments, the layer of dielectric material is disposed to cover the layer of thermally conductive material, when present, and the heating device. Also, the encapsulation layer of thermal insulating material is disposed to cover the layer of dielectric material.

In some embodiments, the heating device is configured in a cut-to-length manner to enable cutting of a length of the heating device to fit the length of the plurality of tubing structures in their connected configuration. In some embodiments, the heating device includes two heater traces embedded within the encasing material, with the two heater traces positioned in a substantially parallel relationship to each other along the length of the heating device. Also, in some embodiments, a bridging wire is electrically connected to each of the two heater traces at a first end of the heating device, and a first electrical lead is electrically connected to a first of the two heater traces at a second end of the heating device, and a second electrical lead is electrically connected to a second of the two heater traces at the second end of the heating device. The first and second electrical leads are configured for respective connection to positive and negative terminals of an electrical power supply.

Additionally, in some embodiments, the heating device is configured to have a serpentine shape along the length of the heating device, such as described with regard to FIG. 5. The serpentine shape increases an amount of the two heater traces present per unit length along the length of the plurality of tubing structures in their connected configuration. The serpentine shape also enables flexibility of the heating device, such that the heating device can be positioned along bends within the tubing assembly. It should be understood, however, that in other embodiments the heating device may not have a serpentine shape, e.g., may rather have a tape-like shape, but will still have sufficient flexibility to be positioned along bends within the tubing assembly.

The cost structure of conventional heating device supply and installation for tubing weldments is dominated by the manual labor necessary to: 1) engineer many layers in the construction of a conventional heater jacket that is designed specifically for a particular tubing weldment with little opportunity for reusability, and 2) program the cutting, and 3) have the layers cut as needed, and most importantly 4) aligning the heating devices and bond them together. It should be understood that the present invention provides improved methods and systems for heating a fluid-carrying tubing weldment, i.e., tubing assembly, by bonding a cut-to-length, flexible, heating device to the tube weldment, with encapsulation of the bonded heating device by a thermal insulator. The flexible, cut-to-length heating device, e.g., heating device 500, can be manufactured in bulk quantity, perhaps in a roll configuration, without consideration of any particular tubing assembly to which the heating device will ultimately be applied. This independent heating device manufacturing capability provides for significant cost savings in comparison with the above-mentioned cost structure of conventional heating device supply and installation.

It should also be appreciated that the method for manufacturing tubing assemblies with integral heating components as disclosed herein provides for relief of component crowding within tight spaces around and near the tubing assemblies when installed in the semiconductor fabrication facility. For example, by integrating heating components within the tubing assemblies, in the manner disclosed herein, the number of electrical connections for heating the tubing network is reduced, which thereby reduces component crowding that would have otherwise been caused by an excessive number of electrical connections. Also, by reducing the number of required electrical connections and correspondingly reducing the component crowding around and near where the tubing assemblies are to be installed within the semiconductor fabrication facility, the installation of the tubing assemblies having the integral heating components is simplified. Also, integration of the heating components with the tubing assemblies, as disclosed herein, lends itself to automation, as disclosed herein, which in turn can lead to reduced cost for temperature controlled tubing networks within the semiconductor fabrication facility.

The foregoing description of the embodiments has been provided for purposes of illustration and description. It is not intended to be exhaustive or to limit the invention. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the invention, and all such modifications are intended to be included within the scope of the invention.

Although the foregoing invention has been described in some detail for purposes of clarity of understanding, it will be apparent that certain changes and modifications can be practiced within the scope of the appended claims. Accordingly, the present embodiments are to be considered as illustrative and not restrictive, and the invention is not to be limited to the details given herein, but may be modified within the scope and equivalents of the described embodiments.

What is claimed is:

1. A tubing assembly, comprising:
   a plurality of tubing structures connected to each other in a configuration providing one or more fluid pathways through the plurality of tubing structures from a fluid entrance of the plurality of tubing structures to a fluid exit of the plurality of tubing structures;
   a heating device bonded to the plurality of tubing structures along a length of the plurality of tubing structures in their connected configuration, the heating device having a flexibility to enable its placement along one or more bends present along the length of the plurality of tubing structures in their connected configuration, the heating device including one or more heater traces embedded within an encasing material, the encasing material being thermally conductive and electrically insulative, the one or more heater traces formed of a material that generates heat in the presence of an electrical current, the heating device having a continuous and unbroken structure along the length of the plurality of tubing structures in their connected configuration, wherein the heating device is configured to have a serpentine shape along the length of the heating device; and an encapsulation layer of thermal insulating material disposed over the plurality of tubing structures and covering the heating device.

2. The tubing assembly as recited in claim 1, wherein the plurality of tubing structures are welded together to provide the one or more fluid pathways through the plurality of tubing structures.

3. The tubing assembly as recited in claim 1, wherein the plurality of tubing structures includes at least two tubing structures that are connected within the tubing assembly at an angled configuration relative to each other such that an angle of less than 180 degrees exists between axial centerlines of the at least two tubing structures.

4. The tubing assembly as recited in claim 1, further comprising:
a layer of a thermally conductive material conformally disposed on the plurality of tubing structures so as to circumferentially cover the plurality of tubing structures, the heating device bonded to the layer of thermally conductive material along the length of the plurality of tubing structures in their connected configuration, the encapsulation layer of thermal insulating material disposed to cover the layer of thermally conductive material and the heating device.

5. The tubing assembly as recited in claim 4, wherein the layer of thermally conductive material is applied to the plurality of tubing structures using a cold spray coating application.

6. The tubing assembly as recited in claim 4, wherein the layer of thermally conductive material is copper and the plurality of tubing structures are formed of stainless steel.

7. The tubing assembly as recited in claim 4, wherein the layer of thermally conductive material is aluminum and the plurality of tubing structures are formed of stainless steel.

8. The tubing assembly as recited in claim 1, further comprising:
a layer of a thermally conductive material conformally disposed on the plurality of tubing structures so as to circumferentially cover the plurality of tubing structures, the heating device bonded to the layer of thermally conductive material along the length of the plurality of tubing structures in their connected configuration; and
a layer of a dielectric material conformally disposed on the plurality of tubing structures so as to circumferentially cover the plurality of tubing structures, the layer of dielectric material disposed to cover the layer of thermally conductive material and the heating device, the encapsulation layer of thermal insulating material disposed to cover the layer of dielectric material.

9. The tubing assembly as recited in claim 1, further comprising:
a layer of an abrasion resistant material disposed over the encapsulation layer of thermal insulating material.

10. The tubing assembly as recited in claim 1, wherein the heating device is configured in a cut-to-length manner to enable cutting of a length of the heating device to fit the length of the plurality of tubing structures in their connected configuration.

11. The tubing assembly as recited in claim 10, wherein the heating device includes two heater traces embedded within the encasing material, the two heater traces positioned in a substantially parallel relationship to each other along the length of the heating device.

12. The tubing assembly as recited in claim 11, further comprising:
a bridging wire electrically connected to each of the two heater traces at a first end of the heating device;
a first electrical lead electrically connected to a first of the two heater traces at a second end of the heating device; and
a second electrical lead electrically connected to a second of the two heater traces at the second end of the heating device, the first and second electrical leads configured for respective connection to positive and negative terminals of an electrical power supply.

13. The tubing assembly as recited in claim 11, wherein the serpentine shape increasing an amount of the two heater traces present per unit length along the length of the plurality of tubing structures in their connected configuration, the serpentine shape enabling flexibility of the heating device.

14. A method for manufacturing a tubing assembly, comprising:
connecting a plurality of tubing structures together in a tubing assembly configuration providing one or more fluid pathways through the plurality of tubing structures from a fluid entrance of the tubing assembly configuration to a fluid exit of the tubing assembly configuration;
bonding a heating device to the plurality of tubing structures along a length of the tubing assembly configuration, the heating device having a flexibility to enable its placement along one or more bends present along the length of tubing assembly configuration, the heating device including one or more heater traces embedded within an encasing material, the encasing material being thermally conductive and electrically insulative, the one or more heater traces formed of a material that generates heat in the presence of an electrical current, the heating device having a continuous and unbroken structure along the length of the tubing assembly configuration, wherein the heating device is configured to have a serpentine shape along the length of the heating device; and
applying an encapsulation layer of thermal insulating material over the tubing assembly configuration to cover the heating device.

15. The method for manufacturing the tubing assembly as recited in claim 14, wherein connecting the plurality of tubing structures together includes welding the plurality of tubing structures together.

16. The method for manufacturing the tubing assembly as recited in claim 14, wherein the plurality of tubing structures includes at least two tubing structures that are connected within the tubing assembly configuration at an angled configuration relative to each other such that an angle of less than 180 degrees exists between axial centerlines of the at least two tubing structures.

17. The method for manufacturing the tubing assembly as recited in claim 14, further comprising:
applying a layer of thermally conductive material conformally on the plurality of tubing structures so as to circumferentially cover the plurality of tubing structures, wherein bonding the heating device to the plurality of tubing structures includes bonding the heating device to the layer of thermally conductive material along the length of the tubing assembly configuration, and wherein the encapsulation layer of thermal insulating material is applied to cover the layer of thermally conductive material and the heating device.

18. The method for manufacturing the tubing assembly as recited in claim 17, wherein the layer of thermally conductive material is applied using a cold spray coating application.

19. The method for manufacturing the tubing assembly as recited in claim 17, further comprising:
applying a layer of a dielectric material conformally on the plurality of tubing structures to cover the layer of thermally conductive material and the heating device, wherein the encapsulation layer of thermal insulating material is applied to cover the layer of the dielectric material.

20. The method for manufacturing the tubing assembly as recited in claim 14, further comprising:
applying a layer of an abrasion resistant material over the encapsulation layer of thermal insulating material.

21. The method for manufacturing the tubing assembly as recited in claim 14, further comprising:
cutting the heating device to fit the length of the tubing assembly configuration, the heating device cut from a larger continuous supply of the heating device.

22. The method for manufacturing the tubing assembly as recited in claim 21, wherein the heating device includes two heater traces embedded within the encasing material, the two heater traces positioned in a substantially parallel relationship to each other along the length of the heating device.

23. The method for manufacturing the tubing assembly as recited in claim 22, wherein the serpentine shape increasing an amount of the two heater traces present per unit length along the length of the tubing assembly configuration, the serpentine shape enabling flexibility of the heating device.

24. The tubing assembly as recited in claim 1, wherein the serpentine shape of the heating device is formed by regularly spaced slits located at opposing sides of the heating device in an alternating manner along the length of the heating device.

25. The tubing assembly as recited in claim 24, wherein the regularly spaced slits are configured to enable flexibility of the heating device.

26. The tubing assembly as recited in claim 24, wherein adjacently positioned slits of the regularly spaced slits along the length of the heating device include a first slit and a second slit, the first slit extending across the heating device from a first side of the heating device, the second slit extending across the heating device from a second side of the heating device, a portion of the first slit extending past a portion of the second slit.

27. The tubing assembly as recited in claim 24, wherein the first and second slits extend across the heating device in a substantially parallel manner.

* * * * *